United States Patent
Ji et al.

(10) Patent No.: US 11,276,458 B2
(45) Date of Patent: Mar. 15, 2022

(54) MEMORY INCLUDING A 1R1RW BITCELL STORAGE ARRAY AND METHODS THEREOF

(71) Applicant: Huawei Technologies Co., Ltd., Shenzhen (CN)

(72) Inventors: Bingwu Ji, Shenzhen (CN); Tanfu Zhao, Shenzhen (CN); Yunming Zhou, Shenzhen (CN); Min Fan, Xi'an (CN); Zhiyan Li, Xi'an (CN); Yunpeng Wang, Xi'an (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 17/080,242

(22) Filed: Oct. 26, 2020

(65) Prior Publication Data

US 2021/0043245 A1 Feb. 11, 2021

Related U.S. Application Data

(63) Continuation of application No. PCT/CN2019/083666, filed on Apr. 22, 2019.

(30) Foreign Application Priority Data

Apr. 27, 2018 (CN) .......................... 201810399279.3

(51) Int. Cl.
*G11C 8/00* (2006.01)
*G11C 11/4091* (2006.01)
(Continued)

(52) U.S. Cl.
CPC .......... *G11C 11/4091* (2013.01); *G11C 7/106* (2013.01); *G11C 7/1087* (2013.01);
(Continued)

(58) Field of Classification Search
CPC .................................................... G11C 7/1072
(Continued)

(56) References Cited

U.S. PATENT DOCUMENTS 6,130,843 A 10/2000 Lee
9,311,990 B1 4/2016 Rawat et al.
(Continued)

FOREIGN PATENT DOCUMENTS

CN 101057300 A 10/2007
CN 101346772 A 1/2009
(Continued)

*Primary Examiner* — Hoai V Ho
(74) *Attorney, Agent, or Firm* — Slater Matsil, LLP

(57) ABSTRACT

A memory and a signal processing method are provided. The memory includes a latch circuit, a decoding circuit, a storage array, a read circuit, and a write circuit. The storage array includes M rows and N columns of bitcells. The latch circuit is configured to receive a first address and a second address. The decoding circuit is configured to: determine a first bitcell based on the first address, and determine a second bitcell based on the second address. The write circuit is configured to: receive data, and write the data into the first bitcell through a first port of the first bitcell. The read circuit is configured to read, through the first port of the first bitcell, data stored in the first bitcell; and is further configured to read, through a second port of the second bitcell, data stored in the second bitcell. Implementing this application can implement 1R1RW.

17 Claims, 11 Drawing Sheets

(51) Int. Cl.
  *G11C 7/10*  (2006.01)
  *G11C 11/4074*  (2006.01)
  *G11C 11/408*  (2006.01)
  *G11C 11/4094*  (2006.01)

(52) U.S. Cl.
  CPC ...... *G11C 11/4074* (2013.01); *G11C 11/4085* (2013.01); *G11C 11/4087* (2013.01); *G11C 11/4094* (2013.01)

(58) Field of Classification Search
  USPC .................................................... 365/230.05
  See application file for complete search history.

(56) References Cited

U.S. PATENT DOCUMENTS

| | | | |
|---|---|---|---|
| 9,761,302 B1* | 9/2017 | Lu | G11C 8/16 |
| 2006/0291274 A1* | 12/2006 | Uematsu | G11C 8/16 |
| | | | 365/154 |
| 2010/0254210 A1* | 10/2010 | Liaw | G11C 7/02 |
| | | | 365/230.05 |
| 2010/0259973 A1 | 10/2010 | Houston | |
| 2011/0134706 A1* | 6/2011 | Nii | G11C 8/16 |
| | | | 365/189.04 |
| 2016/0064068 A1 | 3/2016 | Mojumder et al. | |

FOREIGN PATENT DOCUMENTS

| | | |
|---|---|---|
| CN | 102157196 A | 8/2011 |
| CN | 102820053 A | 12/2012 |
| CN | 104464784 A | 3/2015 |

* cited by examiner

1R1W SRAM with a depth of 256, including eight arrays

1R1RW SRAM with a depth of 256, including eight arrays

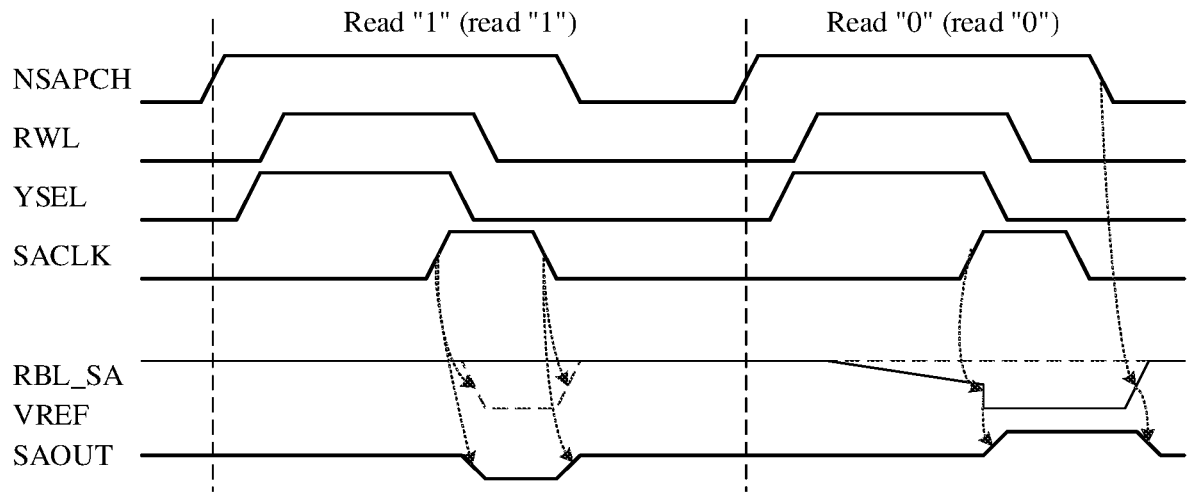

FIG. 14

A memory receives an instruction, where the instruction includes at least one of a first instruction or a second instruction; the first instruction carries a first address, or the first instruction carries a first address and data; and the second instruction carries a second address When the instruction includes the first instruction, and the first instruction carries the first address, the memory reads, through a first port according to the first instruction, data stored in a first bitcell corresponding to the first address; or when the instruction includes the first instruction and the first instruction carries the first address and data, the memory writes the data into a first bitcell through a first port according to the first instruction; and/or when the instruction includes the second instruction, the memory reads, through a second port according to the second instruction, data stored in a second bitcell corresponding to the second address

MEMORY INCLUDING A 1R1RW BITCELL STORAGE ARRAY AND METHODS THEREOF

CROSS-REFERENCE TO RELATED APPLICATIONS

This application is a continuation of International Application No. PCT/CN2019/083666, filed on Apr. 22, 2019, which claims priority to Chinese Patent Application No. 201810399279.3, filed on Apr. 27, 2018. The disclosures of the aforementioned applications are hereby incorporated by reference in their entireties.

TECHNICAL FIELD

This application relates to the field of communications and storage technologies, and in particular, to a memory and a signal processing method.

BACKGROUND

A static random-access memory (SRAM) is a semiconductor memory that is widely used, and may be applied to a plurality of scenarios. For example, the static random-access memory may be used to design an Ethernet switching chip, to provide a caching function, an entry storage function, and the like.

Data in the SRAM is stored in a storage array (a bitcell array) including bitcells. Each bitcell stores 1-bit data. According to different bitcell structures, basic SRAMs provided by memory vendors include the following:

(1) Single-port SRAM (SP SRAM): The single-port SRAM provides one port through which a read operation or a write operation can be performed, and is also referred to as a 1-read or 1-write (1RW) SRAM.

(2) Two-port SRAM (TP SRAM): The two-port SRAM provides one port through which a write operation can be performed and one port through which a read operation can be performed, and is also referred to as a 1-read and 1-write (1R1W) SRAM.

(3) Dual-port SRAM (DP SRAM): The dual-port SRAM provides two ports through which a read operation or a write operation can be performed, and is also referred to as a 2-read and 2-write (2R2W) SRAM.

When a memory vendor provides only the foregoing several basic SRAMs, a multi-port SRAM needs to be constructed based on the foregoing several basic SRAMs, for example, a 2R1W (supporting two read ports and one write port) SRAM, a 1R2W SRAM, or a 2R2W SRAM, to meet the actual requirements.

Currently, application scenarios of 2R1W SRAMs are increasingly wide. For example, a 2R1W SRAM is applied to a system on chip (SOC), to provide a flexible and efficient storage access manner. Many network chips need to use a 2R1W SRAM. How to construct or design an available 2R1W SRAM based on the basic SRAMs is an urgent problem to be resolved.

SUMMARY

This application provides a memory and a signal processing method, to implement 1R1RW and avoid a waste of an area and power consumption.

According to a first aspect, this application provides a memory, including a latch circuit, a decoding circuit, a storage array, a read circuit, and a write circuit. The latch circuit is connected to the decoding circuit, and the storage array is connected to the decoding circuit, the read circuit, and the write circuit.

The storage array includes M rows and N columns of bitcells, each bitcell is configured to store 1-bit data, and the bitcell includes a first port and a second port.

The latch circuit is configured to receive a first address and a second address.

The decoding circuit is configured to determine a first bitcell from the M×N bitcells based on the first address, and is further configured to determine a second bitcell from the M×N bitcells based on the second address.

The write circuit is configured to: receive data, and write the received data into the first bitcell through a first port of the first bitcell.

The read circuit is configured to read, through the first port of the first bitcell, data stored in the first bitcell; and the read circuit is further configured to read, through a second port of the second bitcell, data stored in the second bitcell.

It can be learned from the foregoing that the memory in the first aspect provides two ports: One port may be configured to perform a read operation, and the other port may be configured to perform a read operation or a write operation (perform a read operation or a write operation at a time point), so as to implement 1R1RW.

In an optional embodiment, a connection relationship between the M rows and the N columns of bitcells in the storage array in this application is as follows: Each bitcell in an ith row of bitcells is connected to an ith bit line, an ith bit line bar, and an ith read bit line; and each bitcell in a jth column of bitcells is connected to a jth read/write word line and a jth read word line. $1 \leq i \leq M$, $1 \leq j \leq N$, and i and j are positive integers; the ith bit line, the ith bit line bar, and the jth read/write word line form the first port; and the ith read bit line and the jth read word line form the second port.

In an optional embodiment, structures of all bitcells in the storage array are the same. Descriptions are provided by using an example of a bitcell in the ith row and the jth column. The bitcell in the ith row and the jth column includes eight MOS transistors M1 to M8. M1, M3, M5, M6, M7, and M8 are N-MOS transistors, and M2 and M4 are P-MOS transistors. A source of M2 and a source of M4 are connected to a high level, and a source of M1 and a source of M3 are connected to a ground level; a source of M6, a gate of M2, a gate of M1, a drain of M4, and a drain of M3 are connected; a source of M5, a gate of M4, a gate of M3, a drain of M2, and a drain of M1 are connected; a gate of M5 and a gate of M6 are connected to the jth read/write word line, a drain of M5 is connected to the ith bit line, and a drain of M6 is connected to the ith bit line bar; a gate of M8 is connected to the jth read word line, and a drain of M8 is connected to the ith read bit line; and a source of M8 is connected to a drain of M7, and a source of M7 is connected to the ground level.

It can be learned from the structure of the storage array in the foregoing optional embodiments that, in this application, a structure of a bitcell is fully used, one port of the bitcell is used to perform a read operation, and the other port of the bitcell is used to perform a read operation or a write operation, so as to implement 1R1RW.

In an optional embodiment, the read circuit includes a first sense amplifier and a second sense amplifier, the first sense amplifier is an SA, and the second sense amplifier is an ASA. A first input end of the first sense amplifier is connected to the ith bit line, and a second input end of the first sense amplifier is connected to the ith bit line bar. An input end of the second sense amplifier is connected to the ith read bit line. That the read circuit is configured to read, through the first port of the first bitcell, data stored in the first bitcell specifically includes: the read circuit is configured to output a logical value through an output end of the first sense amplifier after amplifying, by using the first sense amplifier, a difference between a voltage received by the first input end and a voltage received by the second input end. That the read circuit is further configured to read, through a second port of the second bitcell, data stored in the second bitcell specifically includes: the read circuit is configured to output a logical value through an output end of the second sense amplifier after amplifying, by using the second sense amplifier, a voltage received by the input end of the second sense amplifier.

Herein, in the read circuit, the second sense amplifier is used to amplify a voltage signal on a read word line. When the signal is read, it can be ensured that there is sufficient driving force for a subsequent circuit. In this way, a read function can be further added while a write function is implemented on one port in a bitcell in this application, thereby implementing 1R1RW. In other words, the memory in this application can implement 1R1RW while fully using a read/write function of a bitcell and properly planning an area and power consumption.

In an optional embodiment, corresponding peripheral circuits are separately configured for the two ports of the bitcell in this application. Details are as follows:

The latch circuit includes a first address latch circuit and a second address latch circuit. The first address latch circuit is configured to receive the first address, and the second address latch circuit is configured to receive the second address.

The decoding circuit includes a first decoding circuit and a second decoding circuit. The first decoding circuit is configured to determine the first bitcell from the M×N bitcells based on the first address, and the second decoding circuit is configured to determine the second bitcell from the M×N bitcells based on the second address.

The first address latch circuit is connected to the first decoding circuit, the second address latch circuit is connected to the second decoding circuit, the first decoding circuit is connected to the storage array through the first port, and the second decoding circuit is connected to the storage array through the second port.

The read circuit includes a first read circuit and a second read circuit. The first read circuit is configured to read, through the first port of the first bitcell, data stored in the first bitcell; and the second read circuit is configured to read, through the second port of the second bitcell, data stored in the second bitcell.

The first read circuit is connected to the storage array through the first port, and the second read circuit is connected to the storage array through the second port.

In an optional embodiment, in addition to the latch circuit, the decoding circuit, the storage array, the read circuit, and the write circuit, core circuits of the memory provided in this application may further include a control circuit configured to provide operating power for the memory. The control circuit is connected with the latch circuit, the decoding circuit, the write circuit, and the read circuit. The control circuit is configured to receive a first signal and a second signal. The first signal is used to indicate the memory to perform a read operation or a write operation through the first port, and the second signal is used to indicate the memory to perform a read operation through the second port.

In an optional embodiment, the latch circuit is further configured to receive a read/write enable signal. When the read/write enable signal takes a first value, the first signal is specifically used to indicate the memory to perform a write operation through the first port; or when the read/write enable signal takes a second value, the first signal is specifically used to indicate the memory to perform a read operation through the first port.

In an optional embodiment, the first signal includes a first port enable signal and a first port clock signal. When receiving the first signal, the control circuit is further configured to: provide a clock signal for the latch circuit, the decoding circuit, and the write circuit; or provide a clock signal for the latch circuit, the decoding circuit, and the read circuit. The second signal includes a second port enable signal and a second port clock signal. The control circuit is further configured to provide a clock signal for the latch circuit, the decoding circuit, and the read circuit when receiving the second signal.

According to a second aspect, this application provides a signal processing method, including: A memory receives an instruction. The instruction includes at least one of a first instruction or a second instruction. The memory is the memory according to any one of the first aspect and the implementations of the first aspect. The first instruction carries a first address, or the first instruction carries a first address and data; and the second instruction carries a second address.

When the instruction includes the first instruction and the first instruction carries the first address, the memory reads, through a first port according to the first instruction, data stored in a first bitcell corresponding to the first address; or when the instruction includes the first instruction and the first instruction carries the first address and the data, the memory writes data into a first bitcell through a first port according to the first instruction; and/or when the instruction includes the second instruction, the memory reads, through a second port according to the second instruction, data stored in a second bitcell corresponding to the second address.

Implementing this application can implement 1R1RW while fully using a read/write function of a bitcell and properly planning an area and power consumption.

BRIEF DESCRIPTION OF THE DRAWINGS

FIG. 14 is a schematic diagram of a waveform of a working signal of an ASA according to this application; and FIG. 15 is a schematic flowchart of a signal processing method according to this application.

DETAILED DESCRIPTION OF ILLUSTRATIVE EMBODIMENTS

Terms used in an implementation part of this application are used only to explain specific embodiments of this application, and are not intended to limit this application.

To better describe this application, several basic bitcell structures and working principles thereof are first described in detail.

(1) SP SRAM Bitcell

Figure 1A:
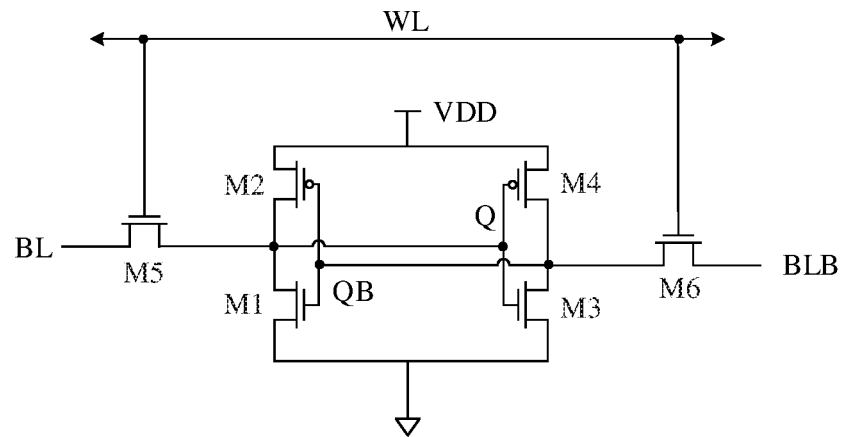
FIG. 1A is a schematic structural diagram of a bitcell of an SP SRAM.

Referring to FIG. 1A, a bitcell in an SP SRAM storage array includes six metal-oxide-semiconductor (MOS) field-effect transistors, that is, six MOS transistors including two P-channel MOS transistors and four N-channel MOS transistors.

In the 6T bitcell shown in FIG. 1A, four MOS transistors in the middle are configured to store bits, and the other two MOS transistors form a control switch between the bitcell and a bit line (BL) and a control switch between the bitcell and a bit line bar (BLB). The BL and the BLB are used for reading and writing.

Figure 1B:
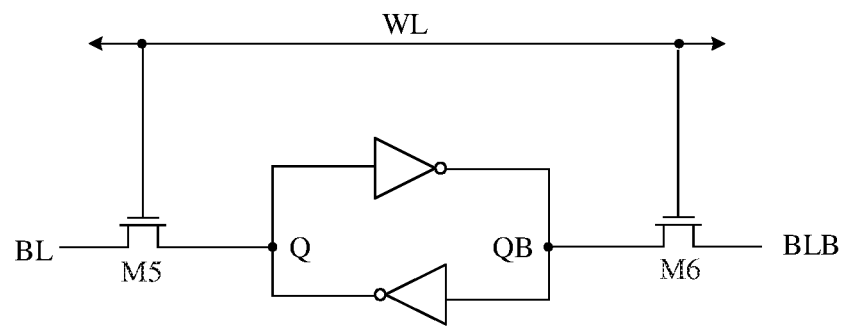
FIG. 1B is another schematic structural diagram of a bitcell of an SP SRAM.

For ease of description, FIG. 1A is simplified into FIG. 1B. The four MOS transistors in the middle in FIG. 1A are simplified into two cross-coupled inverters, a truth value of the bitcell is stored at a point Q, and an inverse value of the bitcell is stored at a point QB.

Before the data is read, the bit line BL and the bit line bar BLB are pre-charged to a specific voltage value (for example, pre-charged to a high level), then a level of a word line (WL) is increased to a high level, and M5 and M6 are turned on. The M5 on the left outputs the stored truth value such as "0" to the bit line BL, and the M6 on the right outputs the stored inverse value such as "1" to the bit line bar BLB, the bit line BL and the bit line bar BLB output, through sensing by a connected differential sense amplifier (SA), the truth value "0" stored in the bitcell.

During data writing, a written value is written into a bit line. For example, when data "1" is written into the bitcell, a truth value "1" is input to the bit line BL, and an inverse value "0" is input to the bit line bar BLB, to form complementary input. Then, a level of the word line WL is increased to a high level, M5 and M6 are turned on, a truth value stored in the bitcell is forcibly changed to "1", and an inverse value is forcibly changed to "0". Then, the level of the word line WL is decreased to a ground level, M5 and M6 are turned off, and the values are saved in the bitcell.

It can be learned from the foregoing description that the word line WL, the bit line BL, and the bit line bar BLB of the SP SRAM form a port through which a read operation or a write operation can be performed, and the read operation and the write operation cannot be performed simultaneously. Therefore, the SP SRAM may also be referred to as a 1RW SRAM.

(2) TP SRAM Bitcell

Figure 2:
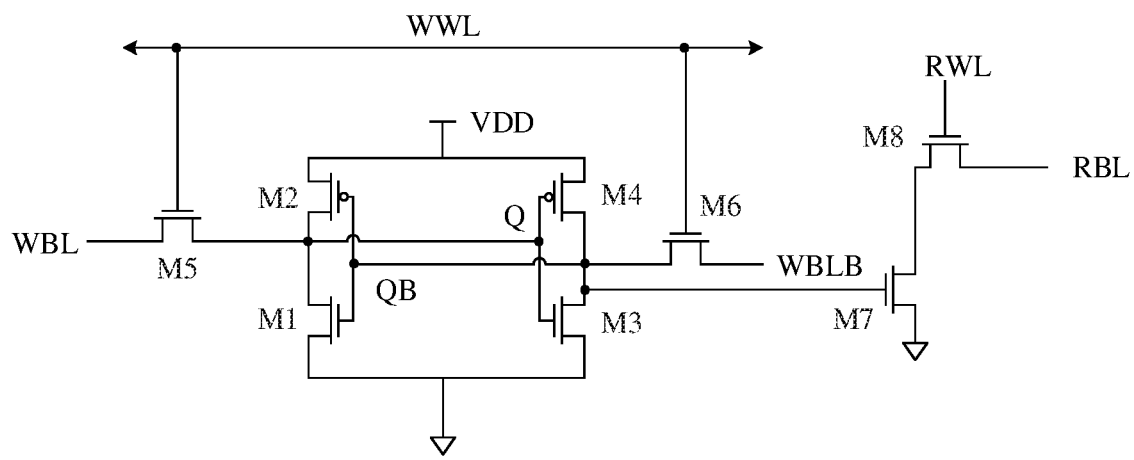
FIG. 2 is a schematic structural diagram of a bitcell of a TP SRAM.

As shown in FIG. 2, a bitcell in a TP SRAM storage array includes eight MOS transistors, and includes two more MOS transistors (M7 and M8) on the right than the SP SRAM bitcell. A truth value of the bitcell is stored at a point Q, and an inverse value is stored at a point QB. WWL is short for write word line, RWL is short for read word line, WBL is short for write bit line, WBLB is short for write bit line bar, and RBL is short for read bit line.

During data reading, a level of the read word line RWL is increased to a high level, and M8 is turned on. If a truth value stored in the bitcell is "0", M7 is turned on, and a value of the read bit line RBL is "0". If a truth value stored in the bitcell is "1", QB="0", M7 is turned off, and a value of the read bit line RBL is a pre-charge value "1" of a read/write (input and output, IO) circuit connected to the bitcell, to read the stored value "1". Herein, the pre-charge value of the IO circuit is provided by a control circuit (which may also be referred to as a clock generation circuit) of a memory.

During data writing, similar to the foregoing SP SRAM, in the TP SRAM, a level of the write word line WWL is increased to a high level to turn on a write path, a value enters a feedback circuit including M1, M2, M3, and M4 through the write bit line WBL and the write bit line bar WBLB, the level of the write word line WWL is decreased to a ground level to turn off the write path, and the value is stored in the bitcell.

It can be learned from the foregoing that the write word line WWL, the write bit line WBL, and the write bit line bar WBLB of the TP SRAM form a port through which a write operation can be performed; the read word line RWL and the read bit line RBL of the TP SRAM form a port through which a read operation can be performed; and the read operation and the write operation may be performed simultaneously. Therefore, the TP SRAM may also be referred to as a 1R1W SRAM.

(3) DP SRAM Bitcell

Figure 3:
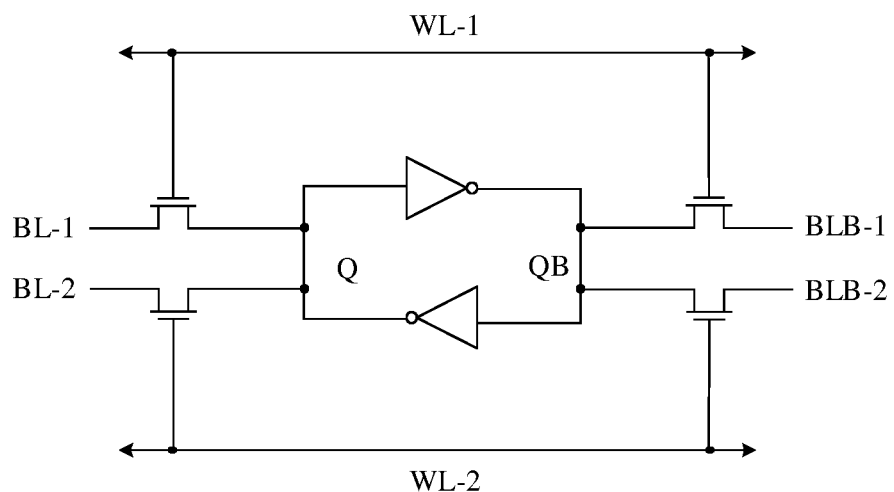
FIG. 3 is a schematic structural diagram of a bitcell of a DP SRAM.

As shown in FIG. 3, a bitcell in a DP SRAM storage array also includes eight MOS transistors, and includes two word lines, two bit lines, and two bit line bars. A process of reading data from the bitcell or writing data into the bitcell is similar to the process of reading data from the SP SRAM or writing data into the SP SRAM. Reference may be made to the foregoing description, and details are not described herein again.

The DP SRAM includes two ports. A word line WL-1, a bit line BL-1, and a bit line bar BLB-1 form a port through which a read operation or a write operation can be performed; a word line WL-2, a bit line BL-2, and a bit line bar BLB-2 form another port through which a read operation or a write operation can be performed; and the read operation and the write operation may be performed simultaneously. Therefore, the DP SRAM may also be referred to as 1RW1RW SRAM.

The foregoing describes several basic bitcells, and the following briefly describes how to implement a 2R1W SRAM based on a basic bitcell in the prior art.

The 2R1W SRAM includes two ports: A read operation can be performed through one port, and a read operation or a write operation can be performed through the other port. To better reflect a correspondence between a port of an SRAM and a read/write function, in subsequent descriptions of this application, a 2R1W SRAM is referred to as a 1R1RW SRAM. That is, "1R" corresponds to one port, and "1RW" corresponds to the other port. Understandably, the two ports of the 1R1RW SRAM can work at a same time without affecting each other. That is, at a same time, a read operation can be performed through one port, and a read operation or a write operation can be performed through the other port. It may be understood that, when a read operation and a write operation are simultaneously performed on a same bitcell through two ports, generally, only data writing accuracy can be ensured, but data reading accuracy cannot be ensured.

In the prior art, a DP SRAM is used to implement 1R1RW. Specifically, 1R1RW can be implemented by discarding a write (W) function of one of the two ports of the DP SRAM. It is clearly that this design manner can implement 1R1RW, but wastes a circuit area and power consumption.

This application provides a memory, to implement 1R1RW and avoid a waste of a circuit area and power consumption. According to the memory in this application, the foregoing basic bitcell (2), that is, the eight-transistor (8T) bitcell shown in FIG. 2, is used to form a storage array. The memory in this application includes two ports: One port can be used to perform a read operation, and the other port can be used to perform a read operation or a write operation.

It can be learned from the foregoing descriptions of the 8T bitcell in FIG. 2 that the 8T bitcell is usually used to construct a TP SRAM including one port that can be used to perform a read operation and one port that can be used to perform a write operation. In fact, from a perspective of the structure of the 8T bitcell, the 8T bitcell can be used to construct one port that can be used to perform a read operation and one port through which a read operation or a write operation can be performed (that is, six transistors on the left can be used to implement a read or write function, and two transistors on the right can be used to implement a read function). However, in the prior art, the 8T bitcell of this structure is not used to construct a 1R1RW memory. The following describes reasons in detail step by step.

1. In the prior art, a capacity of an array constructed by using the 8T bitcell shown in FIG. 2 is limited.

Generally, a signal of stored data directly read from a memory is comparatively weak, and a differential sense amplifier (SA) needs to be used to amplify a read value, to output a comparatively strong signal. In this case, a sufficiently large driving force is provided for a subsequent circuit that uses the stored data, to implement a data access function of the memory.

In the prior art, an SA used to amplify a signal includes two input ends and one output end, and is configured to amplify a difference between two input voltages and then output a logical value. For example, the bit line BL and the bit line bar BLB in FIG. 1A or FIG. 1B are used to output read values. The two input ends of the SA may be connected to the bit line BL and the bit line bar BLB, respectively; and a difference between voltages input by the bit line BL and the bit line bar BLB is amplified, and then a logical value is output through the output end, that is, a value stored at the point Q is output.

However, different from the 6T bitcell shown in FIG. 1A or FIG. 1B, in the 8T bitcell shown in FIG. 2, the two MOS transistors on the right are configured to read data, and only one read bit line RBL is used to output the read data. Because there is only one read bit line RBL, an output signal from the read bit line RBL cannot be amplified by the SA, and the weak signal output by the read bit line RBL can only be directly used to drive a subsequent circuit. To ensure a sufficiently large driving force, a quantity of bitcells loaded to a same bit line is usually limited to a maximum of 32. As a result, a storage capacity of the array including the 8T bitcell shown in FIG. 2 is very limited.

Specifically, the array includes a plurality of bitcells in an array form. Bitcells in each row share a word line, and bitcells in each column share a bit line; or bitcells in each row share a bit line, and bitcells in each column share a word line. If a quantity of bitcells loaded to one bit line is limited to a maximum of 32, a quantity of word lines of the array is also limited to a maximum of 32. Therefore, the storage capacity of the array is limited.

Figure 4:
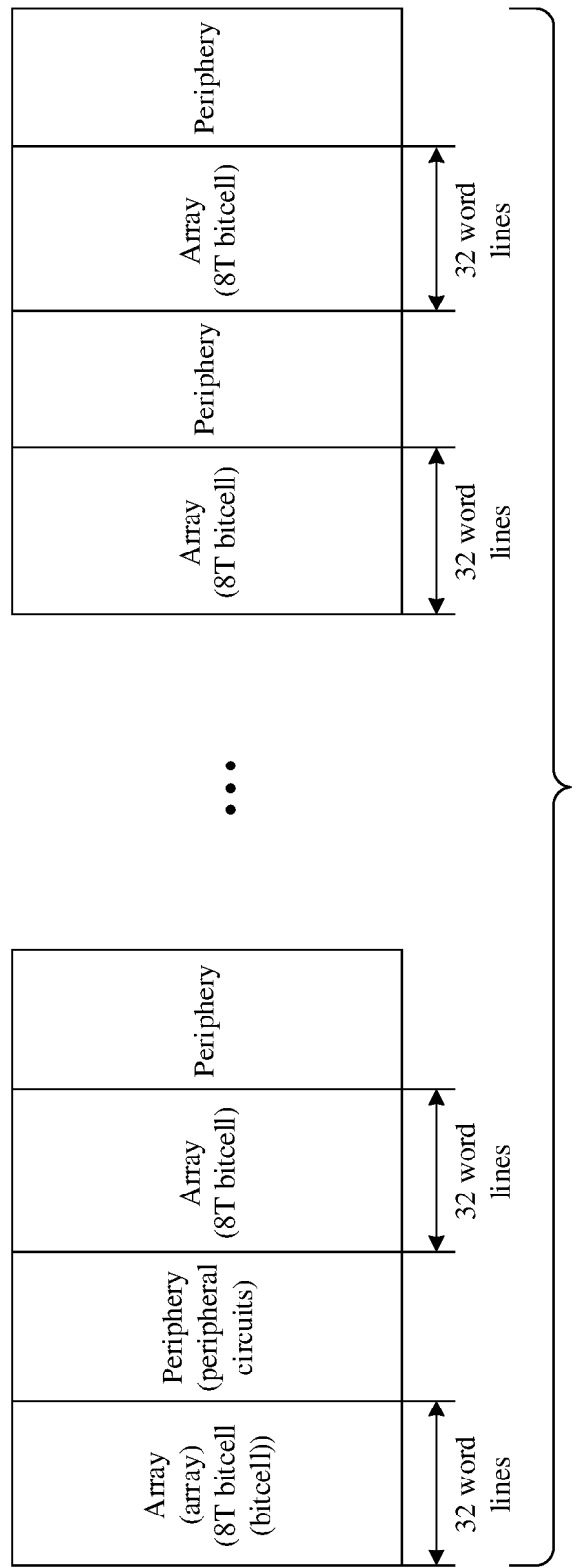
FIG. 4 is a schematic diagram of modules of a 1R1W SRAM in the prior art.

Due to the limited capacity of the array, a layout area of the memory constructed by using the 8T bitcell shown in FIG. 2 is comparatively large. As shown in FIG. 4, when the 8T bitcell shown in FIG. 2 is used to construct a large-capacity 1R1W SRAM, for example, with a depth of 256, eight arrays need to be spliced, and corresponding peripheral circuits (for example, a latch circuit, a decoding circuit, and an amplification circuit) need to be configured for each array. The 1R1RW SRAM has a comparatively large layout area.

2. If the 8T bitcell shown in FIG. 2 is used to construct the 1R1RW SRAM, an area of the peripheral circuit is increased.

Specifically, if the 8T bitcell shown in FIG. 2 is to be used to implement 1R1RW, the six MOS transistors on the left in FIG. 2 need to implement not only a write function but also a read function. Therefore, the peripheral circuits need to include more related circuits (such as a read address decoding circuit and a read address latch circuit) to support the read function, and an area of each peripheral circuit is greatly increased.

Figure 5:
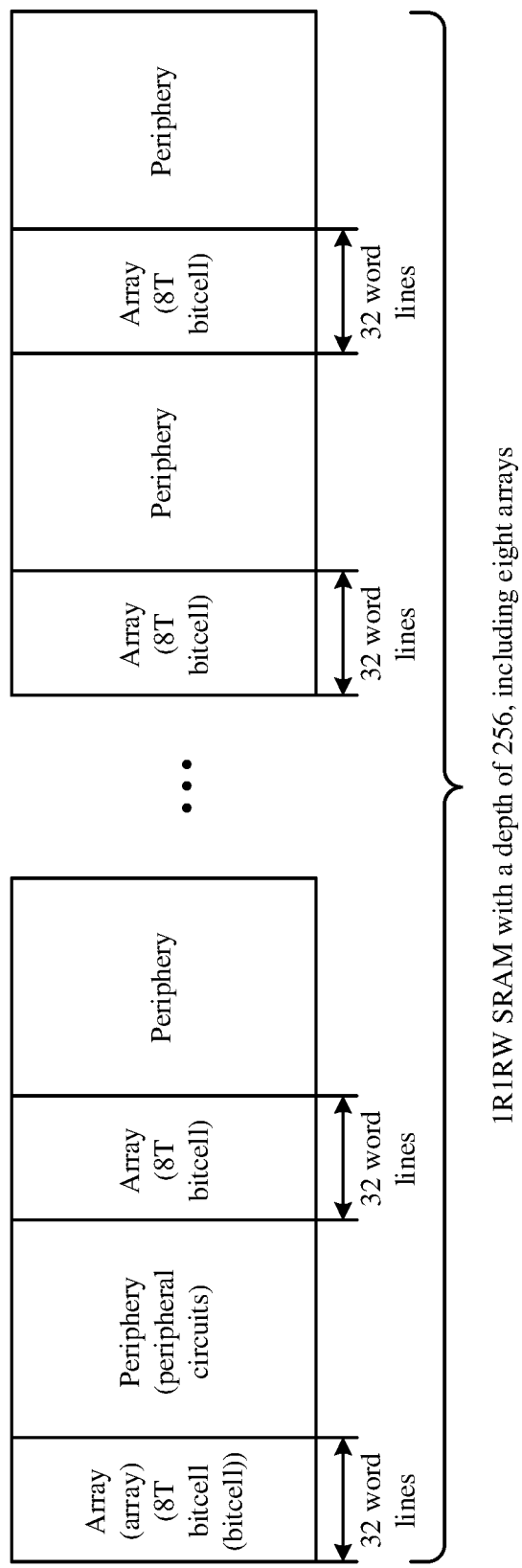
FIG. 5 is a schematic diagram of modules of a 1R1RW SRAM implemented by using the bitcell shown in FIG. 2.

Referring to FIG. 5, when the 8T bitcell shown in FIG. 2 is used to implement the 1R1RW SRAM with a depth of 256, an area of each peripheral circuit is greatly increased, resulting in a serious waste of resources. Consequently, no customer is willing to use this construction solution.

3. In this application, the 8T bitcell shown in FIG. 2 is used to implement 1R1RW, so that an area of a peripheral circuit can be greatly reduced.

Figure 6:
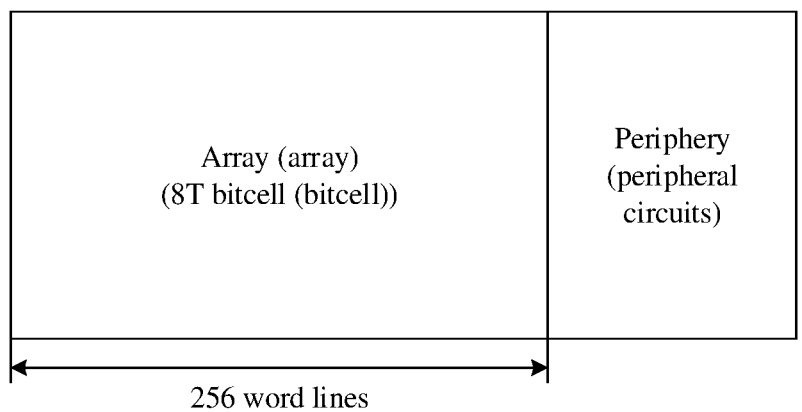
FIG. 6 is a schematic diagram of modules of a 1R1RW SRAM according to this application.

In the array in this application, a quantity of bitcells that can be loaded to one bit line is greater than that in FIG. 4 and that in FIG. 5. Therefore, a storage capacity of the array is greater than that in FIG. 4 and that in FIG. 5. As shown in FIG. 6, in this application, when the 8T bitcell shown in FIG. 2 is used to construct a large-capacity 1R1RW SRAM, for example, with a depth of 256, there is no need to splice a plurality of arrays, and only one or a few arrays may be used for implementation. Correspondingly, only one or a few peripheral circuits need to be configured. In this way, even if an area of a single peripheral circuit is increased because the read function of the six MOS transistors on the left of the 8T bitcell shown in FIG. 2 is added, the layout area of the entire memory is still greatly reduced due to a decrease in a quantity of peripheral circuits.

The following describes in detail a structure and an implementation principle of the 1R1RW memory in this application.

Figure 7:
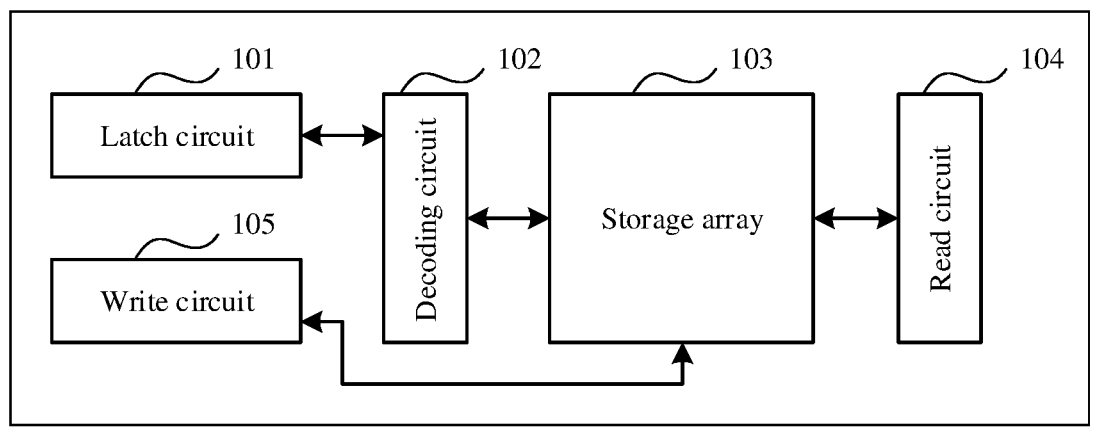
FIG. 7 is a schematic structural diagram of a 1R1RW SRAM according to this application.

FIG. 7 is a schematic structural diagram of a 1R1RW memory according to this application. As shown in FIG. 7, the 1R1RW memory in this application includes at least the following parts: a latch circuit 101, a decoding circuit 102, a storage array 103, a read circuit 104, and a write circuit 105. The latch circuit 101 is connected to the decoding circuit 102, and the storage array 103 is connected to the decoding circuit 102, the read circuit 104 and the write circuit 105.

In this application, the storage array 103 includes M rows and N columns of bitcells, each bitcell is configured to store 1-bit data, and the bitcell includes a first port and a second port.

The latch circuit 101 is configured to receive a first address and a second address.

The decoding circuit 102 is configured to determine a first bitcell from the M×N bitcells based on the first address, and is further configured to determine a second bitcell from the M×N bitcells based on the second address.

The write circuit 105 is configured to: receive data, and write the received data into the first bitcell through a first port of the first bitcell.

The read circuit 104 is configured to read, through the first port of the first bitcell, data stored in the first bitcell; and the read circuit 104 is further configured to read, through a second port of the second bitcell, data stored in the second bitcell.

It can be learned from the foregoing that the 1R1RW memory in this application provides two ports: One port can be used to perform a read operation, and the other port can be used to perform a read operation or a write operation, to implement a function of the 1R1RW.

FIG. 7 and related descriptions briefly describe a structure of the 1R1RW memory in this application. The following separately describes an internal structure of each circuit, a connection relationship between the circuits, and a working principle.

1. Latch Circuit and Decoding Circuit

In this application, the latch circuit is configured to receive the first address and the second address. Herein, the latch circuit can latch the received addresses for use by a subsequent circuit. The first address corresponds to a first port, and the second address corresponds to a second port. The first port is a port through which the memory performs a read operation or a write operation, and the second port is a port through which the memory performs a read operation. For meanings and structures of the first port and the second port, refer to subsequent related descriptions of a storage array. Details are not described herein.

Figure 8:
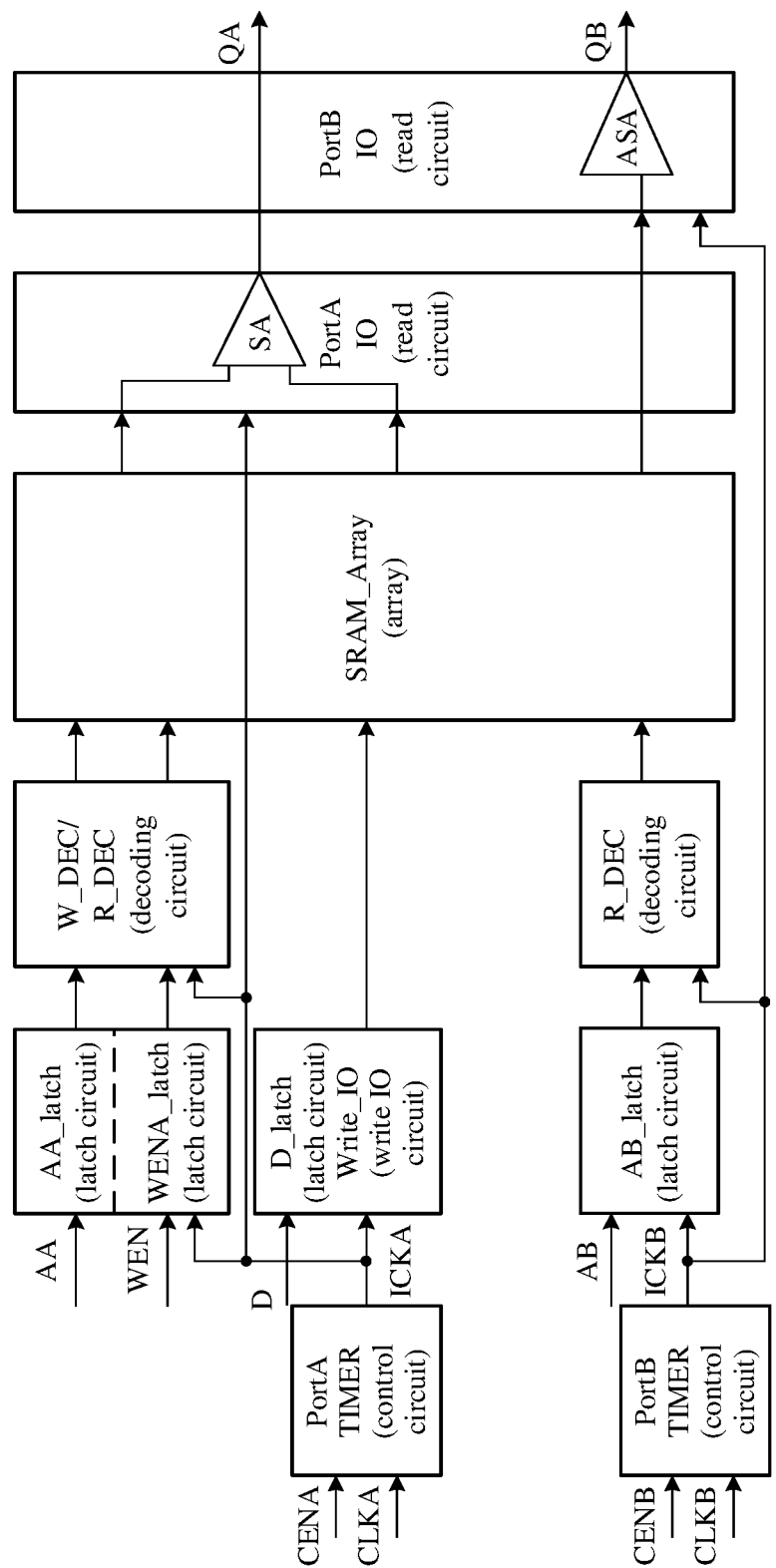
FIG. 8 is another schematic structural diagram of a 1R1RW SRAM according to this application.

In an optional embodiment, referring to FIG. 8, the latch circuit in this application includes a first address latch circuit (AA_latch) and a second address latch circuit (AB_latch). The first address latch circuit is configured to receive the first address (AA). The second address latch circuit is configured to receive the second address (AB).

Figure 9:
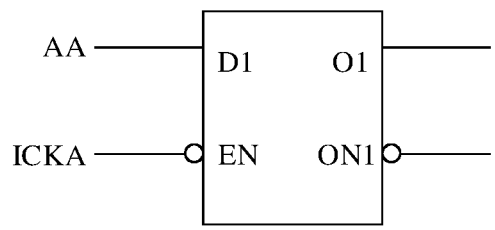
FIG. 9 is a schematic structural diagram of a latch circuit according to this application.

FIG. 9 shows a possible implementation of a latch circuit. Both the first address latch circuit and the second address latch circuit may be implemented as the latch circuit of a structure shown in FIG. 9, or may be implemented as a latch circuit of another structure. The structure is not limited in this application. Optionally, the first address latch circuit is used as an example. When the latch circuit in FIG. 9 is a negative latch, and ICKA (which is a clock signal that is generated after a clock control signal CLK of a memory passes through a buffer and that has a large driving capability) is low-level, the first address AA is transmitted from D1 to O1 for output, and is transmitted to ON1 for output after being reversed; or when ICKA is high-level, the latch is in a maintenance mode, and retains values at O1 and ON1.

In this application, the decoding circuit is configured to determine the first bitcell from the M×N bitcells based on the first address, and is further configured to determine the second bitcell from the M×N bitcells based on the second address. It may be understood that the first bitcell may be any one of the M×N bitcells of the storage array, and the second bitcell may also be any one of the M×N bitcells of the array. The first bitcell and the second bitcell may be a same bitcell, or may be different bitcells.

In an optional embodiment, referring to FIG. 8, the decoding circuit in this application includes a first decoding circuit (W_DEC/R_DEC) and a second decoding circuit (R_DEC). The first decoding circuit is configured to determine the first bitcell from the M×N bitcells based on the first address (AA). The second decoding circuit is configured to determine the second bitcell from the M×N bitcells based on the second address (AB). The first address latch circuit (AA_latch) is connected to the first decoding circuit, the second address latch circuit (AB_latch) is connected to the second decoding circuit, the first decoding circuit is connected to the storage array through the first port, and the second decoding circuit is connected to the storage array through the second port.

The first decoding circuit is used as an example for description. The first decoding circuit is configured to determine a unique bitcell from the M rows and N columns of bitcells based on the first address. Optionally, the first decoding circuit may specifically include a row decoder and a column decoder. The row decoder is configured to determine a row, and the column decoder is configured to determine a column. It may be understood that an implementation principle of the second decoding circuit is the same as that of the first decoding circuit.

2. Write Circuit

In this application, the write circuit is configured to: receive the data, and write the received data into the first bitcell through the first port of the first bitcell. Herein, referring to FIG. 8, the write circuit may also be considered as a data latch circuit (D_latch), that is, a write IO circuit (Write_IO); and can latch the received data (D) for use by a subsequent circuit.

The write circuit is connected to the storage array through a first port. The data received by the write circuit corresponds to the first port, and the first port is a unique port through which the memory performs a write operation. For a meaning and a structure of the first port, refer to subsequent related descriptions of the storage array. Details are not described herein.

Figure 10:
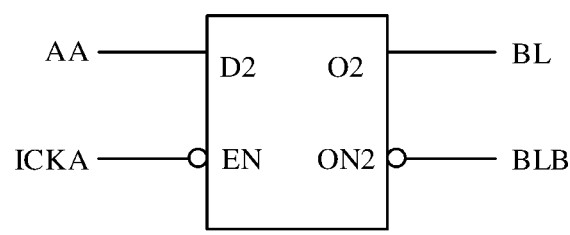
FIG. 10 is a schematic structural diagram of a write circuit according to this application.

FIG. 10 shows a possible implementation of a data latch circuit. As shown in the figure, the data latch circuit is similar to an address latch circuit. When ICKA is high-level, the data latch circuit is turned on, and data arrives at a port O2 from a port D2. When ICKA is low-level, values of O2 and ON2 are maintained, that is, values of a bit line BL and a bit line bar BLB that are connected to the data latch circuit remain unchanged.

It may be understood that the read circuit in this application may be implemented as the latch circuit of a structure shown in FIG. 10, or may be implemented as a latch circuit of another structure. The structure is not limited in this application.

3. Storage Array

In this application, the storage array includes M rows and N columns of bitcells, each bitcell is configured to store 1-bit data, and the bitcell includes a first port and a second port.

Figure 11:
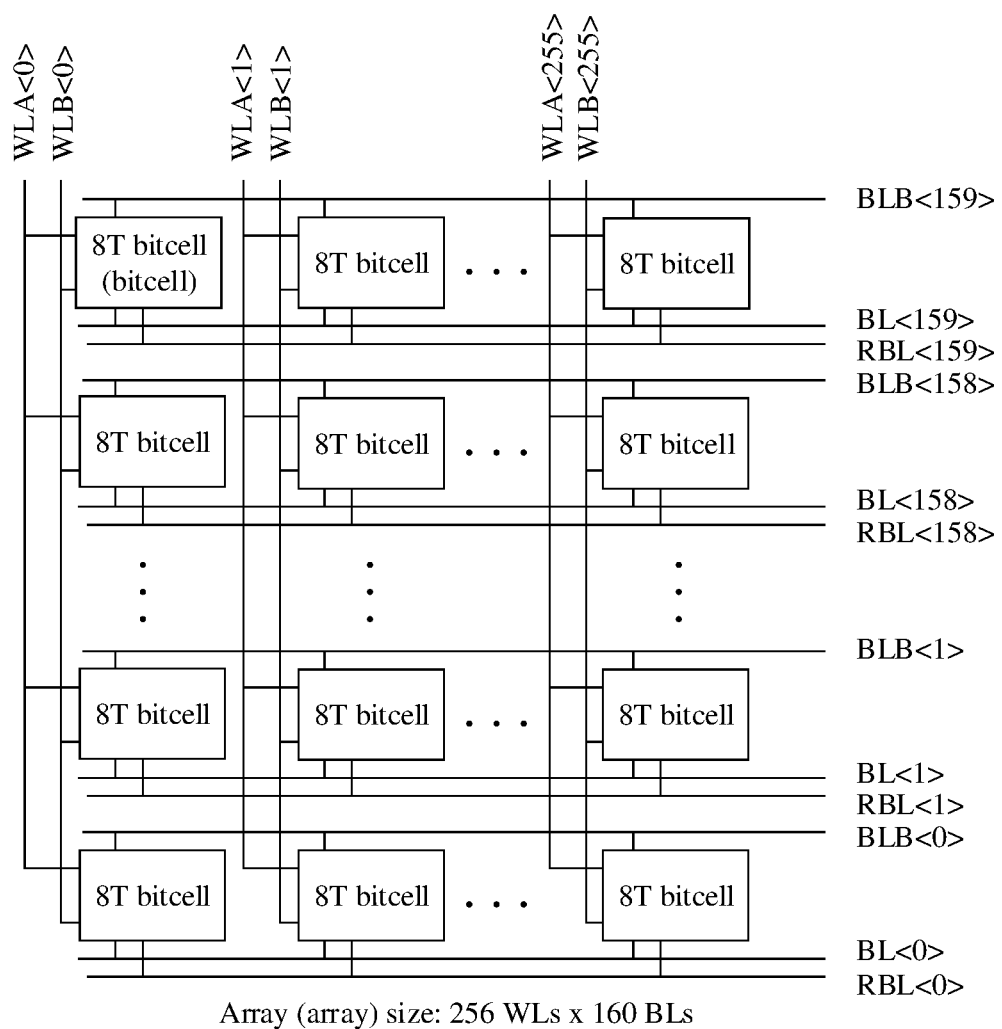
FIG. 11 is a schematic structural diagram of a storage array in a 1R1RW SRAM according to this application.

FIG. 11 shows a possible layout manner of the storage array. As shown in FIG. 11, the bitcells in the array are connected by using 3×M bit lines and 2×N word lines. N bitcells in each row share three bit lines (including one bit line BL, one bit line bar BLB, and one read bit line RBL). M bitcells in each column share two word lines (including one read/write word line WLA and one read word line WLB). It may be understood that, in FIG. 11, descriptions are provided by using an example in which M=160 and N=256.

Specifically, each bitcell in an $i^{th}$ row of bitcells is connected to an $i^{th}$ bit line BL<i−1>, an $i^{th}$ bit line bar BLB<i−1>, and an $i^{th}$ read bit line RBL<i−1>. Each bitcell in a $j^{th}$ column of bitcells is connected to a $j^{th}$ read/write word line WLA<j−1> and a $j^{th}$ read word line WLB<j−1>. Herein, 1≤i≤M, 1≤j≤N, i and j are positive integers.

The $i^{th}$ bit line BL<i−1>, the $i^{th}$ bit line bar BLB<i−1>, and the $j^{th}$ read/write word line WLA<j−1> form a first port of a bitcell in the $i^{th}$ row and the $j^{th}$ column; and the i read bit line RBL<i−1> and the $j^{th}$ read word line WLB<j−1> form a second port of the bitcell in the $i^{th}$ row and the $j^{th}$ column.

Figure 12:
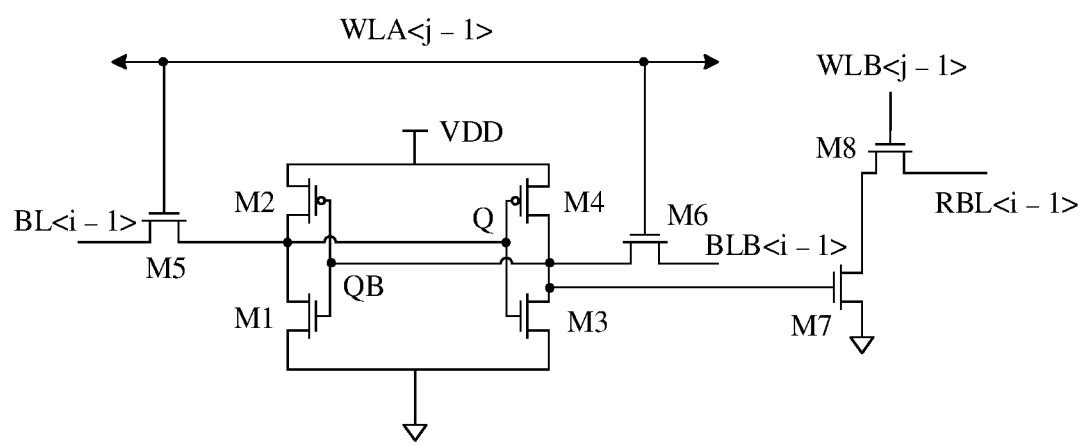
FIG. 12 is a schematic structural diagram of a bitcell in a 1R1RW SRAM according to this application.

FIG. 12 is an internal structural diagram of the bitcell in the $i^{th}$ row and the $j^{th}$ column of the array according to this application. As shown in the figure, in this application, an 8T bitcell having the same structure as that shown in FIG. 2 is used as a bitcell in a storage array. However, six MOS transistors on the left implement not only a write function but also a read function.

The following uses a bitcell in an $i^{th}$ row and a $j^{th}$ column of the array as an example to describe an internal structure of the bitcell in this application and a connection relationship. As shown in FIG. 12, the bitcell includes eight MOS transistors M1 to M8. M1, M3, M5, M6, M7, and M8 are N-MOS transistors, and M2 and M4 are P-MOS transistors. Herein, the N-MOS transistor and the P-MOS transistor each include three electrodes: a gate, a source, and a drain. A turn-on condition of the N-MOS transistor is that a potential of the gate is higher than a potential of the source by one N-MOS threshold voltage, and a turn-on condition of the P-MOS transistor is that a potential of the gate is lower than a potential of the source by one P-MOS threshold voltage.

As shown in FIG. 12, an internal connection relationship of the bitcell is as follows: A source of M2 and a source of M4 are connected to a high level, and a source of M1 and a source of M3 are connected to a ground level; a source of M6, a gate of M2, a gate of M1, a drain of M4, and a drain of M3 are connected; a source of M5, a gate of M4, a gate of M3, a drain of M2, and a drain of M1 are connected; a gate of M5 and a gate of M6 are connected to the $j^{th}$ read/write word line WLA<j−1>; a drain of M5 is connected to the $i^{th}$ bit line BL<i−1>, and a drain of M6 is connected to the $i^{th}$ bit line bar BLB<i−1>; a gate of M8 is connected to the $j^{th}$ read word line WLB<j−1>, and a drain of M8 is connected to the $i^{th}$ read bit line RBL<i−1>; and a source of M8 is connected to a drain of M7, and a source of M7 is connected to the ground level.

Herein, a structure of the six MOS transistors on the left of the 8T bitcell shown in FIG. 12 is the same as that of the bitcell shown in FIG. 1A or FIG. 1B. A port formed by the six MOS transistors on the left may be used to perform a read operation or a write operation for the bitcell, and a process of performing the read operation and the write operation is the same as that in FIG. 1A or FIG. 1B. Reference may be made to FIG. 1A or FIG. 1B and related descriptions, and details are not described herein again.

Herein, a port formed by two MOS transistors on the right of the 8T bitcell shown in FIG. 12 may be used to perform a read operation for the bitcell. A process of performing the read operation is the same as the process of performing the read operation by the two MOS transistors on the right of the bitcell shown in FIG. 2. Reference may be made to FIG. 2 and related descriptions, and details are not described herein again.

In an optional embodiment, the 1R1RW memory in this application may include a plurality of arrays shown in FIG. 11, to satisfy a larger storage capacity. It may be understood that, when the memory includes a plurality of arrays, corresponding peripheral circuits, for example, a read circuit, a write circuit, and a decoding circuit, need to be configured for each array.

4. Read Circuit

First, structures of an SA and an asymmetric sense amplifier (ASA) are briefly described.

(1) The SA is a common sense amplifier in the prior art; and can read a small potential difference through two input ends, amplify the potential difference to a full-amplitude logical potential value, and then output the logical potential value.

(2) The ASA is a novel sense amplifier; and can read a potential of a small amplitude through an input port, amplify the potential to a logical potential value, and then output the logical potential value.

Figure 13:
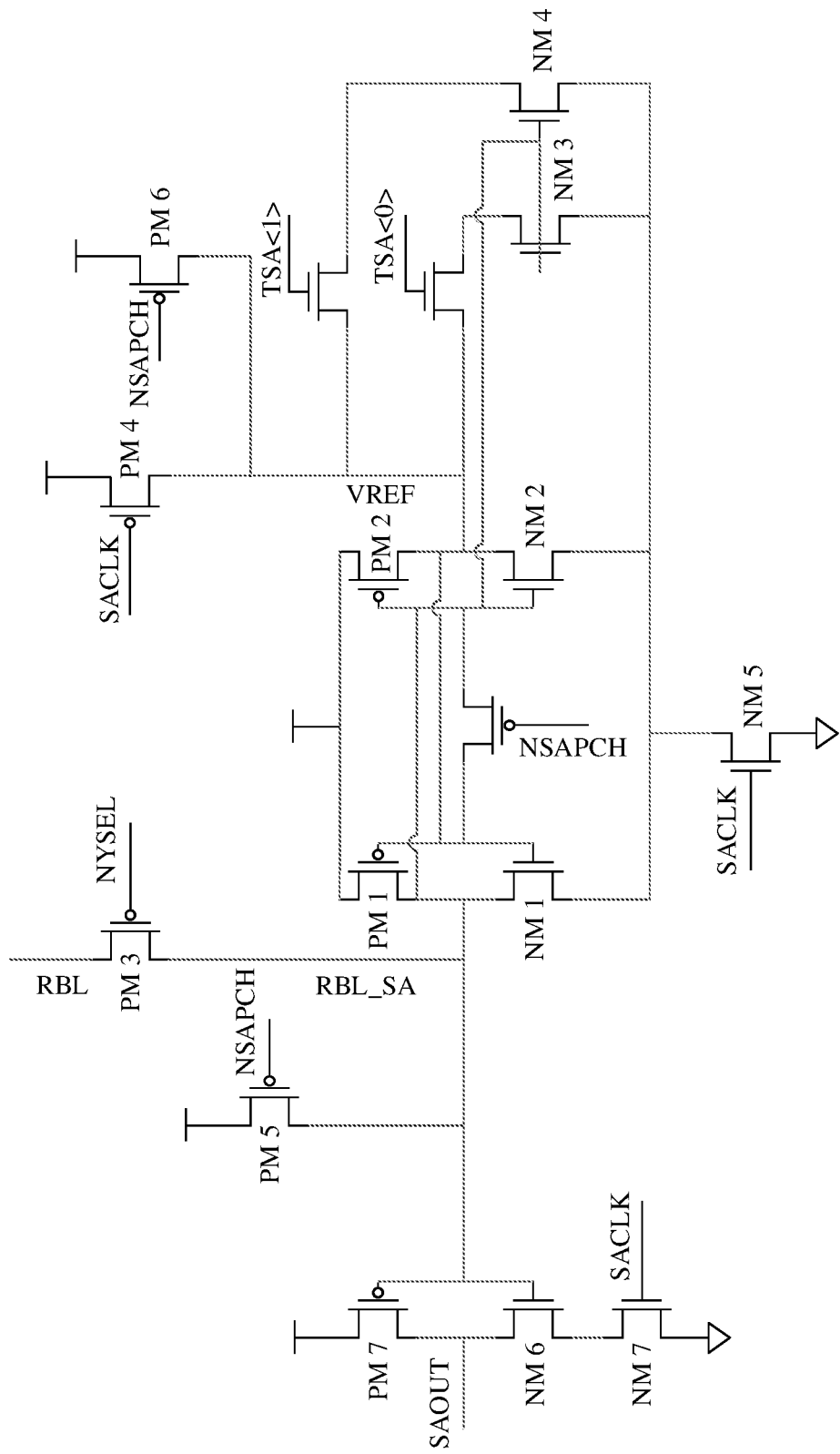
FIG. 13 is a schematic structural diagram of an ASA according to this application.

FIG. 13 is a schematic structural diagram of an ASA according to this application. As shown in the figure, the sense amplifier is based on a voltage-type SA. An NM 1 and an NM 2 that are symmetrically amplified are changed to asymmetrical structures. One comparison signal of the SA comes from a read bit line (RBL) of the bitcell in the array, the other comparison signal of the SA comes from a supply voltage, and a sensing function is implemented by using the asymmetric SA. NSAPCH is a pre-charge signal (which is provided by a clock control circuit) of the ASA. VREF is connected to a power supply of the ASA by using a PM 4, and is used as a reference comparison signal of the sense amplifier. When RBL is "1" and SACLK is enabled, voltages of VREF and RBL_SA are both VDD. However, an NM 3 and an NM 4 help the NM 2 decrease VREF and finally decrease VREF to "0" and increase RBL_SA to "1". When RBL is "0", that is, when RBL is decreased, SACLK is enabled when a voltage of the RBL is decreased to a value large enough to offset impact of the NM 3 and the NM 4, and RBL_SA is decreased to 0, as shown by a waveform in FIG. 14.

It can be learned from the foregoing that the ASA may receive an input voltage through an input end, amplify the voltage, and output an amplified voltage through an output end. It may be understood that the ASA in this application is not limited to the structure shown in FIG. 13, or may be an ASA of another structure having a same function. The structure is not limited in this application.

In this application, the read circuit includes a first sense amplifier and a second sense amplifier, the first sense amplifier is an SA, and the second sense amplifier is an ASA. A first input end of the first sense amplifier is connected to the $i^{th}$ bit line, and a second input end of the first sense amplifier is connected to the $i^{th}$ bit line bar. An input end of the second sense amplifier is connected to the $i^{th}$ read bit line.

The read circuit may read, through the first port of the first bitcell, the data stored in the first bitcell. Specifically, the read circuit outputs a logical value through an output end of the first sense amplifier after amplifying, by using the first sense amplifier, a difference between a voltage received by the first input end and a voltage received by the second input end. Herein, the logical value output through the output end of the first sense amplifier indicates the data stored in the first bitcell.

The read circuit may further read, through the second port of the second bitcell, the data stored in the second bitcell. Specifically, the read circuit outputs a logical value through an output end of the second sense amplifier after amplifying, by using the second sense amplifier, a voltage received by the input end of the second sense amplifier. Herein, the logical value output through the output end of the second sense amplifier indicates the data stored in the second bitcell.

In an optional embodiment, referring to FIG. 8, the read circuit includes a first read circuit (PortA IO) and a second read circuit (PortB IO). The first read circuit is configured to read, through the first port of the first bitcell, data stored in the first bitcell; and the second read circuit is configured to read, through the second port of the second bitcell, data stored in the second bitcell. The first read circuit is connected to the storage array through the first port, and the second read circuit is connected to the storage array through the second port. Optionally, the first read circuit includes the first sense amplifier, and the second read circuit includes the foregoing second sense amplifier.

It can be learned, from the foregoing descriptions of the storage array and the read circuit, that a voltage signal on a read word line of an 8T bitcell in the array in this application may be amplified by the second sense amplifier (ASA); and when a signal is read, it can be ensured that a sufficient driving force can be provided for a subsequent circuit. Therefore, in this application, there may be a comparatively large quantity of bitcells that can be loaded to each bit line in an array, for example, there may be 256 bitcells. That is, there may be a comparatively large quantity of word lines in an array. In other words, a storage capacity of an array in this application increases.

When a storage capacity of an array increases, during implementation of a memory, a requirement on the storage capacity can be met by splicing only one or a few arrays, instead of splicing a plurality of arrays; and a quantity of corresponding peripheral circuits in the memory is reduced. Therefore, after the read function of the six MOS transistors on the left of the 8T bitcell is enabled, compared with the 1R1RW SRAM in FIG. 4, in this application, even if an area of a single peripheral circuit increases, a layout area of the entire memory is still greatly reduced due to a decrease in a quantity of peripheral circuits. In other words, the memory in this application uses the ASA based on the 8T bitcell shown in FIG. 2, so that a read/write function of the 8T bitcell is fully used (that is, one port may be used to perform a read function, and the other port may be used to perform a read function or a write function).

In general, the memory in this application can implement 1R1RW while fully using a read/write function of a bitcell and properly planning an area and power consumption. Compared with a solution in the prior art in which a 1R1RW SRAM is implemented by using a DP SRAM, this application avoids a waste of an area and power consumption.

The foregoing describes in detail the structure and implementation principle of the 1R1RW memory in this application. In addition to the foregoing described core circuits such as the latch circuit, the decoding circuit, the storage array, the read circuit, and the write circuit, the 1R1RW memory in this application may further include a control circuit configured to provide operating power for the memory.

In an optional embodiment, the control circuit is connected to the latch circuit, the decoding circuit, the read circuit, and the write circuit in the memory shown in FIG. 7. In this application, the control circuit is configured to receive a first signal and a second signal. Optionally, referring to FIG. 8, the control circuit may include a first control circuit (PortA TIMER) and a second control circuit (PortB TIMER). The first control circuit is configured to receive the first signal, and the second control circuit is configured to receive the second signal. The first signal is used to indicate the memory to perform a read operation or a write operation through the first port, and the second signal is used to indicate the memory to perform a read operation through the second port.

Optionally, the first signal includes a first port enable signal (CENA) and a first port clock signal (CLKA). The control circuit is further configured to: when the first signal is received, provide, for the latch circuit (for example, AA_latch shown in FIG. 8), the decoding circuit (for example, W_DEC/R_DEC shown in FIG. 8), and the write circuit (for example, D_latch shown in FIG. 8), a clock signal (ICKA) with a greater driving force; or provide a clock signal (ICKA) for the latch circuit, the decoding circuit, and the read circuit (for example, PortA IO shown in FIG. 8). Herein, the memory can perform a write operation or a read operation through the first port only when receiving the first port enable signal. The first port clock signal provides operating power for an operation performed by the memory through the first port.

Optionally, the second signal includes a second port enable signal (CENB) and a second port clock signal (CLKB). The control circuit is further configured to: when receiving the second signal, provide, for the latch circuit (for example, AB_latch shown in FIG. 8), the decoding circuit (for example, R_DEC shown in FIG. 8), and the read circuit (for example, PortB IO shown in FIG. 8), a clock signal (ICKB) with a larger driving force. The clock signal (ICKB) herein is used for a read operation performed through the second port. Herein, the memory can perform a read operation through the second port only when the second port enable signal is received, and the second clock signal provides operating power for an operation performed by the memory through the second port.

Optionally, referring to FIG. 8, in the 1R1RW memory in this application, the latch circuit is further configured to receive a read/write enable signal (WEN). When the read/write enable signal takes a first value (for example, 1), the first signal is specifically used to indicate the memory to perform a write operation through the first port. When the read/write enable signal takes a second value (for example, 0), the first signal is specifically used to indicate the memory to perform a read operation through the first port.

For example, it is assumed that all the enable signals are effective at a ground level, and are ineffective at a high level. Referring to FIG. 8, when receiving the first port enable signal (CENA) (logical value 0), the first port clock signal (CLKA), the read/write enable signal (WEN) (logical value 0), the first address (AA), and the data (D), the memory writes the data (D) into a bitcell, corresponding to the first address, in the storage array. When receiving the first port enable signal (CENA) (logical value 0), the first port clock signal (CLKA), the read/write enable signal (WEN) (logical value 1), and the first address (AA), the memory reads data stored in a bitcell, corresponding to the first address, in the storage array. When receiving the second port enable signal (CENB) (logical value 0), the second port clock signal (CLKB), and the second address (AB), the memory reads data stored in a bitcell, corresponding to the second address, in the storage array.

The following describes a method for storing or reading data by the 1R1RW memory provided in this application. FIG. 15 is a schematic flowchart of a signal processing method according to this application. As shown in the figure, the method may include the following steps.

S110: A memory receives an instruction, where the instruction includes at least one of a first instruction or a second instruction; the first instruction carries a first address, or the first instruction carries the first address and the data; and the second instruction carries a second address.

Herein, the memory is the 1R1RW memory provided in any one of the foregoing possible implementations of this application.

The following separately describes the first instruction and the second instruction.

1. First Instruction

In this application, the first instruction corresponds to a first port of the memory, and the memory may perform a write operation or a read operation through the first port according to the first instruction. The first instruction may carry different information, including the following two types:

(1) The first instruction carries a first address.

Herein, the first address is the first address mentioned when the structure of the memory is described, for example, AA in FIG. 8. For a process in which the memory receives the first instruction, refer to the foregoing related descriptions. In an optional embodiment, the first instruction of type (1) may further include a first signal, and the first signal includes a first port enable signal (CENA) and a first clock signal (CLKA). For details, refer to the foregoing related descriptions of the structure of the memory.

(2) The first instruction carries a first address and data.

Herein, the first address and the data are the first address and the data that are mentioned when the structure of the memory is described, for example, AA and D in FIG. 8. For a process in which the memory receives the first instruction, refer to the foregoing related descriptions. In an optional embodiment, the first instruction of type (2) may further include a first signal, and the first signal includes a first port enable signal (CENA) and a first clock signal (CLKA). For details, refer to the foregoing related descriptions of the structure of the memory.

In an optional embodiment, whether the first instruction received by the memory is of the type (1) or the type (2) may be determined not only by using information carried in the first instruction, but also by using a value of a read/write enable signal (WEN) received by a latch circuit of the memory. For example, when the value of the read/write enable signal (WEN) is "1", it may be determined that the memory receives the first instruction of type (1); or when the value of the read/write enable signal (WEN) is "0", it may be determined that the memory receives the first instruction of type (2).

2. Second Instruction

In this application, the second instruction corresponds to a second port of the memory, and the memory may perform a read operation through the second port according to the second instruction.

In this application, the second instruction carries a second address. Herein, the second address is the second address mentioned when the structure of the memory is described, for example, AB in FIG. 8. For a process in which the memory receives the second instruction, refer to the foregoing related descriptions. In an optional embodiment, the second instruction may further include a second signal, and the second signal includes a second port enable signal (CENB) and a second clock signal (CLKB). For details, refer to the foregoing related descriptions of the structure of the memory.

S120: When the instruction includes the first instruction, and the first instruction carries the first address, the memory reads, through the first port according to the first instruction, data stored in a first bitcell corresponding to the first address; or when the instruction comprises the first instruction and the first instruction carries the first address and the data, the memory writes the data into the first bitcell through the first port according to the first instruction; and when the instruction includes the second instruction, the memory reads, through the second port according to the second instruction, data stored in a second bitcell corresponding to the second address.

Specifically, in this application, the memory performs a corresponding operation according to a received instruction. An operation performed by the memory varies with an instruction received by the memory. Descriptions are provided below based on different cases.

1. The instruction received by the memory includes only the first instruction.

If the memory receives the foregoing first instruction of type (1), a decoding circuit of the memory determines, based on the first address, the first bitcell from the M×N bitcells of the storage array; and reads, through the first port of the first bitcell by using the read circuit, the data stored in the first bitcell.

If the memory receives the foregoing first instruction of type (2), a decoding circuit of the memory determines, based on the first address, the first bitcell from the M×N bitcells of the storage array; and writes, by using the write circuit, the data carried in the first instruction into the first bitcell through the first port of the first bitcell.

2. The instruction received by the memory includes only the second instruction.

Specifically, when the instruction received by the memory includes only the second instruction, a decoding circuit of the memory determines the second bitcell from the M×N bitcells of the storage array based on the second address; and reads, through the second port of the second bitcell by using the read circuit, data stored in the second bitcell.

3. The instruction received by the memory includes the first instruction and the second instruction.

It may be understood that, when the instruction received by the memory includes the first instruction and the second instruction, the memory may perform corresponding operations through the first port and the second port simultaneously, and the operations performed through the two ports do not interfere with each other. For example, when receiving the first instruction of type (1) and the second instruction, the memory may perform a read operation through the first port, and perform a read operation through the second port. When receiving the first instruction of type (2) and the second instruction, the memory may perform a write operation through the first port, and perform a read operation through the second port.

It may be understood that the memory in the signal processing method in this application is the memory described in any one of the implementations in the foregoing structure embodiments. For an implementation of each step in the signal processing method in this application, refer to the foregoing related descriptions of the foregoing memory.

It can be learned from the foregoing descriptions that the signal processing method in this application can implement 1R1RW based on the 1R1RW memory provided in this application.

A person of ordinary skill in the art may understand that all or some of the procedures of the methods in the foregoing embodiments may be implemented by a computer program instructing relevant hardware. The program may be stored in a computer-readable storage medium. When the program is executed, the procedures of the method embodiments may be performed. The foregoing storage medium includes any medium that can store program code, such as a ROM, a random access memory RAM, a magnetic disk, or an optical disc.

What is claimed is:

1. A memory, comprising:
a latch circuit;
a decoding circuit, wherein the latch circuit is connected to the decoding circuit;
a storage array, comprising M rows and N columns of bitcells, wherein each bitcell of the storage array is configured to store 1-bit data, and each bitcell of the storage array comprises a respective first port and a respective second port;
a read circuit, comprising a first sense amplifier and a second sense amplifier, wherein a number of inputs from the storage array to the first sense amplifier is different than a number of inputs from the storage array to the second sense amplifier; and
a write circuit, wherein the storage array is connected to the decoding circuit, the read circuit, and the write circuit; and
wherein:
the latch circuit is configured to receive a first address and a second address;
the decoding circuit is configured to:
determine a first bitcell from the M×N bitcells based on the first address; and
determine a second bitcell from the M×N bitcells based on the second address;
the write circuit is configured to receive data, and write the received data into the first bitcell through a first port of the first bitcell; and
the read circuit is configured to:
read, through the first port of the first bitcell, data stored in the first bitcell; and
read, through a second port of the second bitcell, data stored in the second bitcell.

2. The memory according to claim 1, wherein in the storage array, and for each integer value of i from 1 to M, each bitcell in an $i^{th}$ row of bitcells is connected to an $i^{th}$ bit line, an $i^{th}$ bit line bar, and an $i^{th}$ read bit line; and
wherein in the storage array, for each integer value of j from 1 to N, each bitcell in a $j^{th}$ column of bitcells is connected to a $j^{th}$ read/write word line and a $j^{th}$ read word line; and
wherein, for each bitcell in the storage array, the bit line connected to the respective bitcell, the bit line bar connected to the respective bitcell, and the read/write word line connected to the respective bitcell form the first port of the respective bitcell, and the read bit line connected to the respective bitcell and the read word line connected to the respective bitcell form the second port of the respective bitcell.

3. The memory according to claim 2, wherein:
the first bitcell comprises eight MOS transistors M1 to M8, wherein M1, M3, M5, M6, M7, and M8 are N-MOS transistors, and M2 and M4 are P-MOS transistors;
a source of M2 and a source of M4 are connected to a high level, and a source of M1 and a source of M3 are connected to a ground level;
a source of M6, a gate of M2, a gate of M1, a drain of M4, a drain of M3, and a gate of M7 are connected;
a source of M5, a gate of M4, a gate of M3, a drain of M2, and a drain of M1 are connected;
a gate of M5 and a gate of M6 are connected to the read/write word line connected to the first bitcell, a drain of M5 is connected to the bit line connected to the first bitcell, and a drain of M6 is connected to the bit line bar connected to the first bitcell;
a gate of M8 is connected to the read word line connected to the first bitcell, and a drain of M8 is connected to the read bit line connected to the first bitcell; and
a source of M8 is connected to a drain of M7, and a source of M7 is connected to the ground level.

4. The memory according to claim 3, wherein a first input end of the first sense amplifier is connected to each bit line in the storage array, and a second input end of the first sense amplifier is connected to each bit line bar in the storage array; and
wherein an input end of the second sense amplifier is connected to each read bit line in the storage array.

5. The memory according to claim 4, wherein the second sense amplifier is an asymmetric sense amplifier.

6. The memory according to claim 4, wherein the read circuit is further configured to:
output the data stored in the first bitcell through an output end of the first sense amplifier after amplifying, using the first sense amplifier, a difference between a voltage received by the first input end and a voltage received by the second input end.

7. The memory according to claim 4, wherein the read circuit is further configured to:
output the data stored in the second bitcell through an output end of the second sense amplifier after amplifying, by using the second sense amplifier, a voltage received by the input end of the second sense amplifier.

8. The memory according to claim 1, wherein:
the latch circuit comprises a first address latch circuit and a second address latch circuit, wherein the first address latch circuit is configured to receive the first address, and the second address latch circuit is configured to receive the second address;
the decoding circuit comprises a first decoding circuit and a second decoding circuit, wherein the first decoding circuit is configured to determine the first bitcell from the M×N bitcells based on the first address, and the second decoding circuit is configured to determine the second bitcell from the M×N bitcells based on the second address; and
the first address latch circuit is connected to the first decoding circuit, the second address latch circuit is connected to the second decoding circuit, the first decoding circuit is connected to the storage array through the first port of each bitcell, and the second decoding circuit is connected to the storage array through the second port of each bitcell.

9. The memory according to claim 8, wherein the first decoding circuit comprises a first row decoder and a first column decoder, wherein the first row decoder is configured to determine, based on the first address, a row in which the first bitcell is located in the M×N bitcells, and the first column decoder is configured to determine, based on the first address, a column in which the first bitcell is located in the M×N bitcells.

10. The memory according to claim 8, wherein the second decoding circuit comprises a second row decoder and a second column decoder, wherein the second row decoder is configured to determine, based on the second address, a row in which the second bitcell is located in the M×N bitcells, and the second column decoder is configured to determine, based on the second address, a column in which the second bitcell is located in the M×N bitcells.

11. The memory according to claim 1, wherein:
the read circuit comprises a first read circuit and a second read circuit, wherein the first read circuit is configured to read, through the first port of the first bitcell, data stored in the first bitcell, and the second read circuit is configured to read, through the second port of the second bitcell, data stored in the second bitcell; and the first read circuit is connected to the storage array through the first port of each bitcell, and the second read circuit is connected to the storage array through the second port of each bitcell.

12. The memory according to claim 1, wherein:

the memory further comprises a control circuit, and the control circuit is connected to the latch circuit, the decoding circuit, the write circuit, and the read circuit; and the control circuit is configured to receive a first signal and a second signal, wherein the first signal indicates to the memory to perform a read operation or a write operation through the first port, and the second signal indicates to the memory to perform a read operation through the second port.

13. The memory according to claim 12, wherein:

the latch circuit is further configured to receive a read/write enable signal; and when the read/write enable signal is a first value, the first signal indicates to the memory to perform a write operation through the first port; or when the read/write enable signal is a second value, the first signal indicates to the memory to perform a read operation through the first port.

14. The memory according to claim 12, wherein the first signal comprises a first port enable signal and a first port clock signal, the first port enable signal enables the memory to perform a write operation or a read operation through the first port, and the first port clock signal provides operating power for an operation performed by the memory through the first port.

15. The memory according to claim 12, wherein the second signal comprises a second port enable signal and a second port clock signal, the second port enable signal enables the memory to perform a write operation through the second port, and the second port clock signal provides operating power for an operation performed by the memory through the second port.

16. A method, comprising:

receiving, by a latch circuit, a first address and a second address, wherein a memory comprises the latch circuit, a decoding circuit, a storage array, a read circuit, and a write circuit, wherein the latch circuit is connected to the decoding circuit, the storage array comprises M rows and N columns of bitcells, each bitcell of the storage array is configured to store 1-bit data, each bitcell of the storage array comprises a respective first port and a respective second port, and the storage array is connected to the decoding circuit, the read circuit, and the write circuit, and wherein the read circuit comprises a first sense amplifier and a second sense amplifier, and a number of inputs from the storage array to the first sense amplifier is different than a number of inputs from the storage array to the second sense amplifier;

determining, by the decoding circuit, a first bitcell from the M×N bitcells based on the first address;

determining, by the decoding circuit, a second bitcell from the M×N bitcells based on the second address;

receiving data, by the write circuit, and writing the received data into the first bitcell through a first port of the first bitcell;

reading, by the read circuit through the first port of the first bitcell, data stored in the first bitcell; and reading, by the read circuit through a second port of the second bitcell, data stored in the second bitcell.

17. The method according to claim 16, wherein a first input end of the first sense amplifier is connected to each bit line in the storage array, a second input end of the first sense amplifier is connected to each bit line bar in the storage array, and an input end of the second sense amplifier is connected to each read bit line in the storage array, and the method further comprises:

outputting, by the read circuit, the data stored in the first bitcell through an output end of the first sense amplifier after amplifying, using the first sense amplifier, a difference between a voltage received by the first input end and a voltage received by the second input end.

* * * * *